United States Patent [19]

Wharff

[11] Patent Number: 4,871,106
[45] Date of Patent: Oct. 3, 1989

[54] NON-DEDICATED PALLET ASSEMBLY FOR WAVE SOLDERING PACKAGED INTEGRATED CIRCUITS

[76] Inventor: Charles R. Wharff, 3312 Valley Square La., San Jose, Calif. 95117

[21] Appl. No.: 264,453

[22] Filed: Oct. 28, 1988

[51] Int. Cl.⁴ .................. B23Q 3/00; B23K 37/04
[52] U.S. Cl. .................................. 228/47; 228/254; 269/903; 269/900; 269/239; 269/40; 118/500; 118/503
[58] Field of Search ............... 269/903, 37, 239, 309, 269/40, 45, 900; 228/47, 36, 37, 39, 40, 254; 118/503, 500

[56] References Cited

U.S. PATENT DOCUMENTS

| | | | |
|---|---|---|---|
| 725,464 | 4/1903 | Lutz | 269/309 |
| 971,389 | 9/1910 | Malone | 269/309 |
| 2,706,232 | 4/1955 | Pilas | 269/40 |
| 4,700,935 | 10/1987 | Winslow et al. | 269/903 |
| 4,747,532 | 5/1988 | Sim | 228/47 |
| 4,787,550 | 11/1988 | Masuda et al. | 228/254 |

FOREIGN PATENT DOCUMENTS

| | | | |
|---|---|---|---|
| 2495884 | 6/1982 | France | 228/47 |
| 168668 | 7/1987 | Japan | 228/47 |

Primary Examiner—Richard K. Seidel
Assistant Examiner—Samuel M. Heinrich
Attorney, Agent, or Firm—Michael J. Hughes

[57] ABSTRACT

A non-dedicated pallet assembly (10) is provided to carry and precisely position a plurality of integrated circuit packages (12). The pallet assembly includes an exterior frame subassembly (14) emcompassing an interior frame subassembly (16) formed to include a plurality of receiving nests (48) arrayed in rows thereon. Each receiving nest (48) is adapted to receive a modular package holder (18) in one of several selectable rotational orientations. The preferred modular package holders (18) may be in the form of a finger support holder (126), a surface protection holder (128) or a multi-nest holder (130), each conformed to the shape and dimensions of a selected package (12). Vertical support to the package holders (18) and the packages (12) is provided by a leaf spring (60) associated with each receiving nest (48) and by an openable and closable gate subassembly (20) associated with each pair of rows of receiving nests (48). The gate subassemblies (20) include gate bars (68) having anchor elements (100) adapted to engage the chip packages (12) when the gate is closed. The primary expected usage of the pallet assembly (10) is in wave soldering operations on chip packages (12) of various configurations.

7 Claims, 5 Drawing Sheets

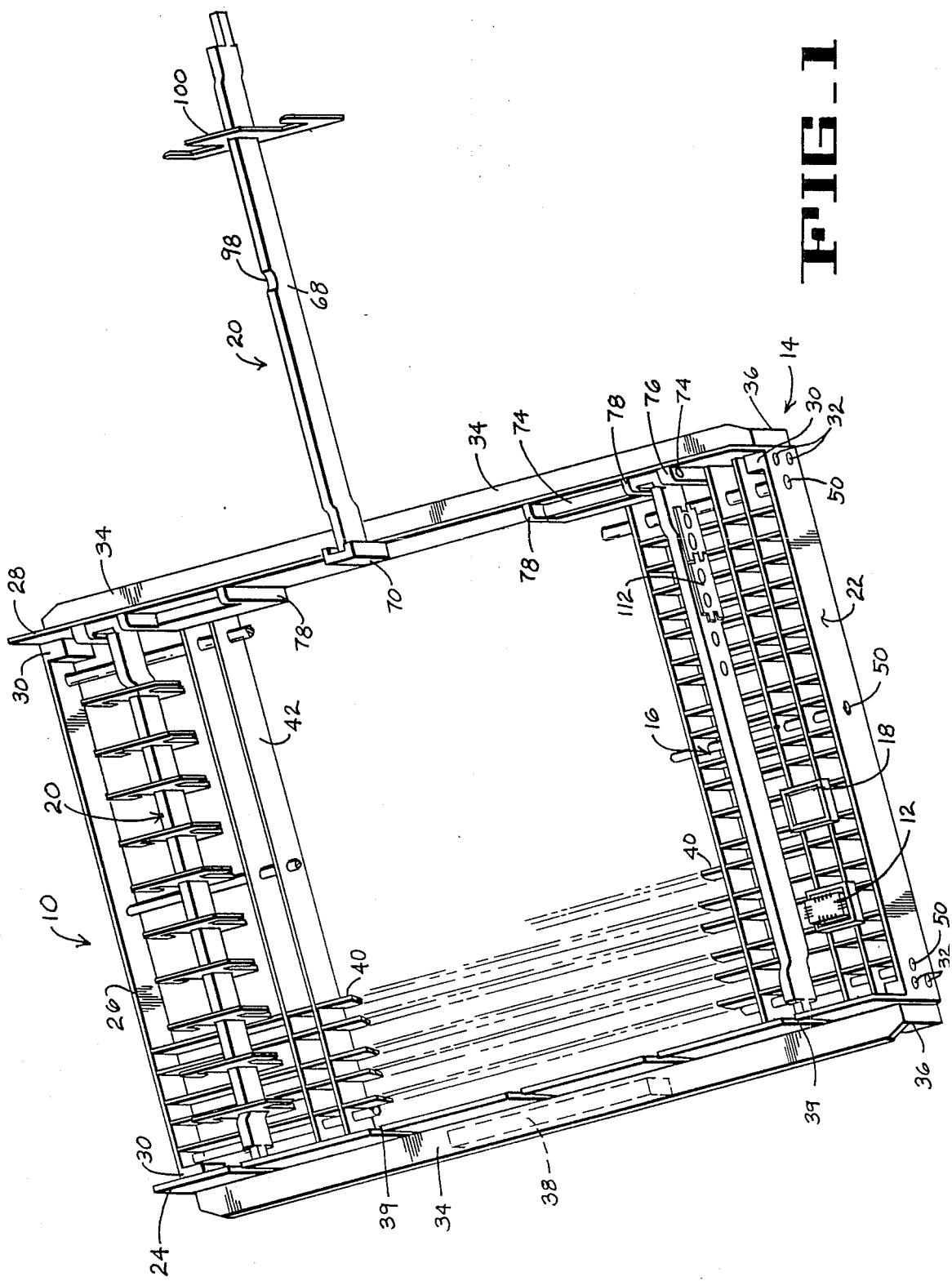

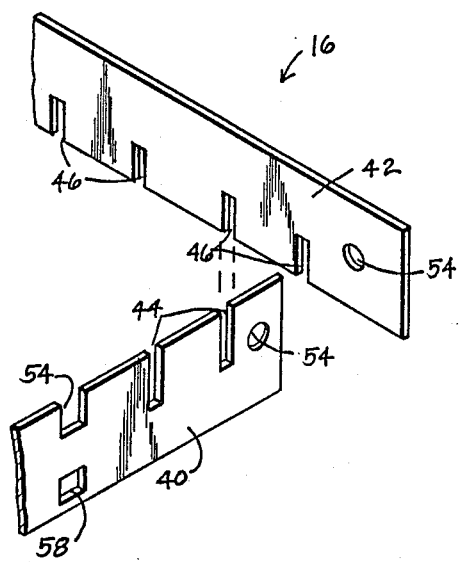
FIG_2
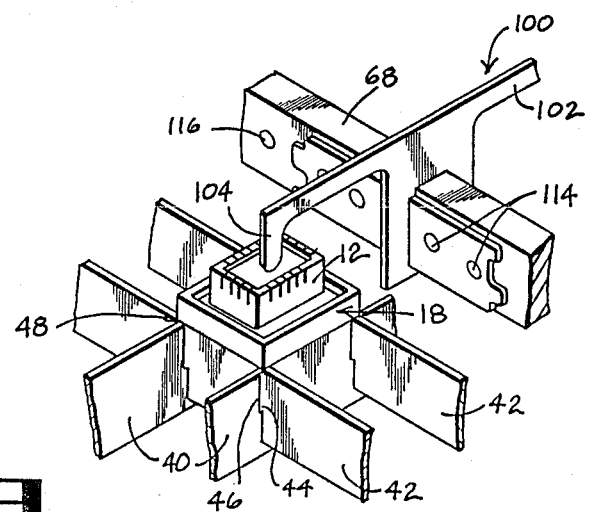
FIG_3
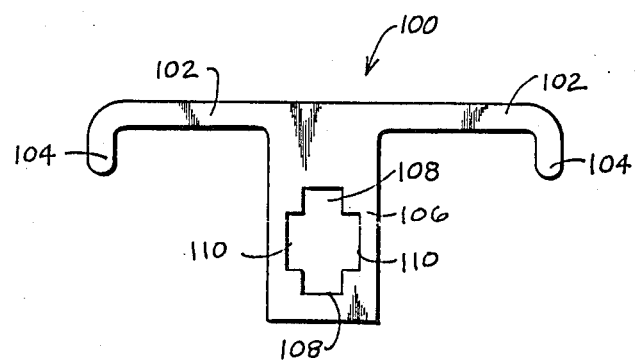
FIG_8

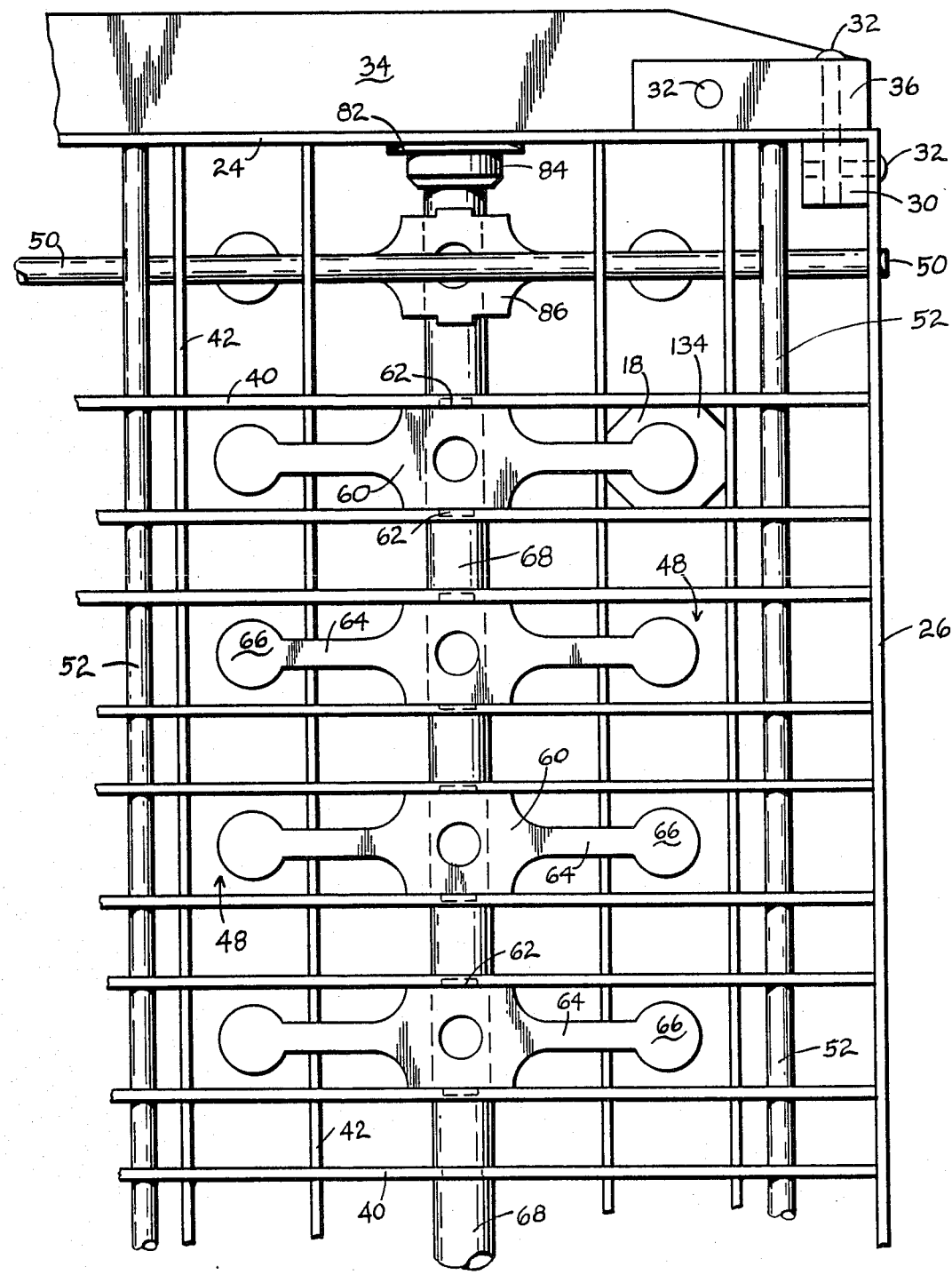
FIG_4

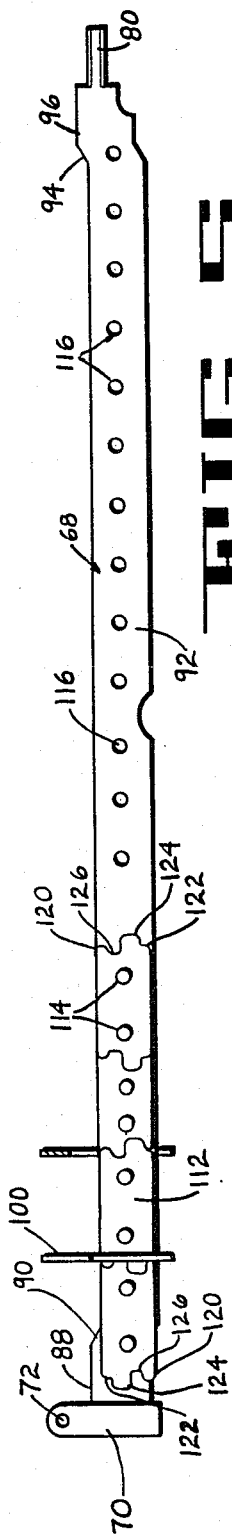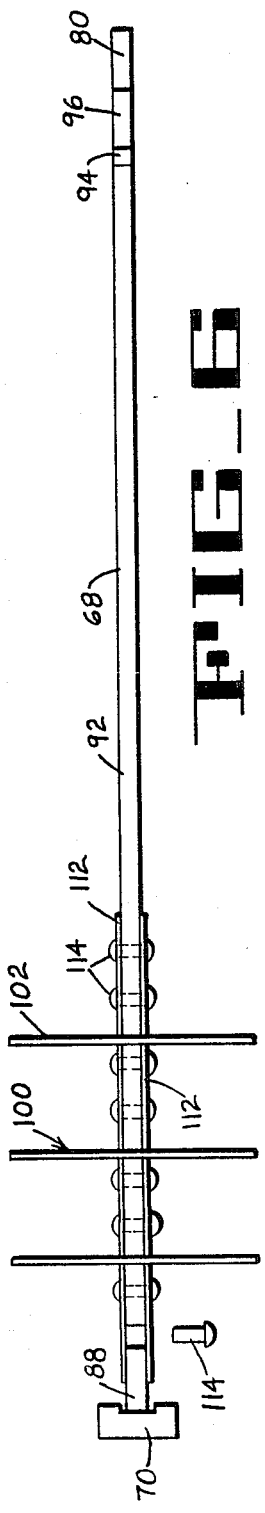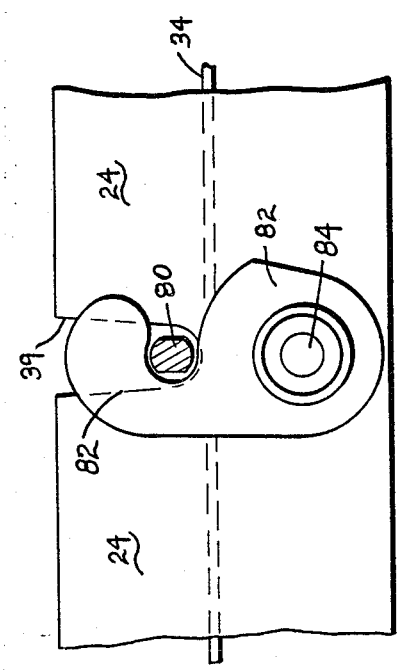

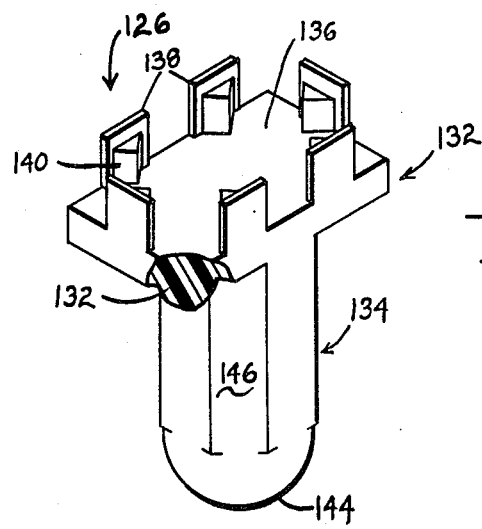
FIG_9
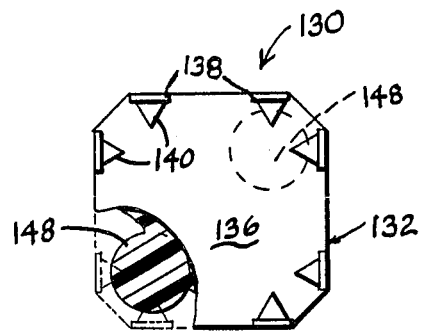
FIG_11
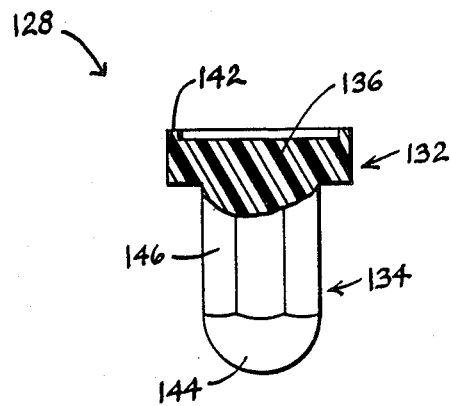
FIG_10

4,871,106

NON-DEDICATED PALLET ASSEMBLY FOR WAVE SOLDERING PACKAGED INTEGRATED CIRCUITS

TECHNICAL FIELD

The present invention relates generally to fixtures used in manufacturing semiconductor integrated circuits and more particularly to those pallets used in wave soldering the lead elements of a packaged integrated circuit. The predominant current usage of the non-dedicated pallet construction of the present invention is in connection with wave soldering of chip carriers in the semiconductor manufacturing industry.

BACKGROUND ART

Over the past few decades the manufacture and packaging of semiconductor components has become one of the largest industries in the world. Microcircuitry and large scale integrated circuitry have become the standard information processing and algorithm enabling devices in a wide variety of technological fields. Accordingly, the demand for such devices as well as the demand for improved quality of such devices has grown astromically.

One feature of semiconductor devices which has been the subject of much research and development is the packaging of the components themselves. It is desirable to place the chip or integrated circuit in a carrier or a package. The carrier or package protects the chip and also provides a mechanism by which the chip may be connected by larger conductive elements known as "leads" to other components. The packages and leads are in a wide variety of forms but all are designed with the idea of placing the chip carrier in juxtaposition with a circuit board or other component and causing the leads to contact the specific portions on the juxtaposed element. This provides an electrical path from the component to the chip.

A step which is necessary in preparing the chip package for use is to wave solder the leads. The solder utilized operates both as a binding element and as a conductive element. The solder is applied in a large scale to chips with the application of substantial heat such that the solder is in liquid form when it impacts the carriers and is then cooled into position.

One of the most efficient manners of applying solder is by use of what is known as a wave solder machine. This sort of device is adapted for use in applying solder essentially simultaneously to a large number of components. In this machine the components are carried through a zone, wherein wave solder is applied, by a conveyer mechanism. The device which is utilized to hold the individual packages during the wave solder process is referred to in the industry as a "pallet". These pallets have come in various different designs.

The most commonly used traditional pallet has been a device which is elongated and onto which individual chips can be slid serially into tracks specifically designed for the type of package involved. These devices typically look to be wire structures. Disadvantages which have been found with the conventional pallets are that they provide no protection for the reverse sides of the packages, they allow the packages to abut against one another and thus give rise to potential damage, and they need to be custom designed for each size of package to be utilized. Furthermore, this sort of structure does not operate well with chip carriers having leads which do not extend beyond the carriers themselves. Flat packages are difficult to both restrain and to make the appropriate surfaces available for soldering in a conventional type pallet.

One other type of pallet which has been subject of a U.S. Patent is described in U.S. Pat. No. 4,700,935, issued Oct. 20, 1987 to R. T. Winslow et al. This pallet or wave soldering fixture is adapted specifically to correct the type of problems of flat packages and other packages which do not adapt well to the conventional wave solder pallets. The Winslow device allows the chip packages to be loaded separately and held in place by a unitary gate mechanism in a carrier portion specifically designed to receive the packages. Each of the fixtures disclosed in Winslow is adapted for receiving packages of a specific size and shape.

Despite the substantial advances which have been made in pallet construction technology there remains great room for improvement. The chip packaging industry continues to create new designs and to expect higher degrees of precision at each stage of the process. Accordingly, it is desirable to create improved methods of carrying the chip packages through the wave solder machines which can accommodate a wider variety of packages and can provide increased protection for the packages during operation, while retaining excellent exposure of the package to the wave solder with minimum exposure of the pallet material, and with excellent precision as to positioning.

SUMMARY OF THE INVENTION

Accordingly, it is an object of the present invention to provide an improved fixture adapted for use in wave soldering leads of packaged integrated circuits.

It is another object of the present invention to provide a flexible non-dedicated fixture which is economical to manufacture and would substantially lower production costs.

It is a further object of the present invention to provide a modularly replaceable apparatus capable of being adaptable for use with an abundant variety of packages without substantial modification of the apparatus.

It is still a further object of the present invention to provide a pallet fixture constructed in a superior manner to similar pallets presently in use, so as to provide longer life.

It is a further object of the present invention to provide a fixture apparatus that increases user and facility safety.

It is yet another object of the present invention to provide a fixture apparatus that may adjust the parting lines of retained packages to a variety of distances relative to wave of solder, without substantial modification of the apparatus.

This invention relates generally to methods of retaining and positioning components relative to a wave of solder. This invention is particularly adapted for use with integrated circuit (chip) packages such as those found (used) in the circuit board manufacturing industry.

Briefly, the preferred embodiment of the present invention is an improved fixture (pallet) for use in positioning and securing packaged integrated circuits. The fixture includes an external rectangular carrier frame, so formed as to enclose a plurality of internal frame subassembly mutually perpendicular including 9 support members of generally rectangular shape. The internal frame structure is connected to and supported on the external carrier frame by a series of connecting rods passing therethrough.

This support member structure is arranged in such a way to comprise a plurality of defined containment cavities ("nests") into which interchangeable package holder element are placed. These holders function as seats to receive and support individual integrated circuit packages. Finally, a plurality of independently operable safe subassemblies, locking down by releasable latch means, attach by hinge means to the external carrier frame, and securely retain each package.

An advantage of the present invention is that it provides a simple, economically manufactured, non-dedicated fixture for use in wave soldering integrated circuit packages.

Another advantage of the present invention is that heterogeneous groups of integrated circuit packages may be run simultaneously within the same fixture.

Still another advantage of the present invention is that different homogenous groups of packages may be run utilizing the same fixture simply by changing holder configurations.

A still further advantage of the present invention is that the backs of integrated circuit packages may be protected from damaging solder by an enclosing package holder design.

A further advantage of the present invention is that the welded pin construction allows the frame to flex and breathe, while preventing any loosening of the apparatus due to the repetitive thermal expansion inherent in the soldering process.

A still further advantage of the present invention is that Teflon TM package holders act to substantially reduce heat transfer through the apparatus, therefore increasing the efficiency of pre-heating packaged leads and decreasing the possibility of solder bumps or bridging.

Yet another advantage of the present invention is that the Teflon TM holders may be rotated relative to the apparatus so as to provide the packaged leads with various angles of contact with a wave of solder as specifications may so require.

Another advantage of the present invention is that spring loaded resistance against the gate subassembly, provided by leaf springs urging the holders toward the gate subassembly, acts to insure rigid retainment of packages even when the apparatus is not fully loaded.

A further advantage of the present invention is that the conveyer riding flange construction acts to provide flexible positioning of the parting lines of packages relative to a wave of solder.

Another advantage of the present invention is that the apparatus helps to prevent flammable flux from discharging from the solder machine, thus providing a safer, cleaner operation.

Still another advantage of the present invention is that modular replaceability and pin construction substantially reduce cleaning, drying, and maintenance costs.

A still further advantage of the present invention is that each gate subassembly is adapted to open and close in a 180 degree arc to provide maximum access to all integrated circuit packages and Teflon TM holders.

Yet another advantage of the present invention is that each gate subassembly structure is firmly latchable and is spring loaded to assure that each component is held firmly in position during use.

Still another advantage of the present invention is that the gate bar is precurved such that bending due to heat expansion and mechanical pressure is compensated for in such a manner that all of the components in the array are equally supported during the wave soldering process.

These and other objects and advantages of the present invention will become clear to those skilled in the art upon review of the following specification, accompanying drawings, and appended claims.

BRIEF DESCRIPTION OF DRAWINGS

FIG. 1 is a partially exploded perspective view of a non-dedicated pallet assembly according the preferred embodiment of the present invention;

FIG. 2 is a detailed perspective view of a portion of the longitudinal and lateral plate components of the interior frame subassembly;

FIG. 3 is a perspective view showing the detail of a single carrier support (receiving nest) zone for a chip carrier;

FIG. 4 is a bottom plan view of a portion of the preferred embodiment;

FIG. 5 is a rear elevational view of a securing gate subassembly of the present invention;

FIG. 6 is a top plan view of the securing gate subassembly of FIG. 5;

FIG. 7 is a detail view of a gate latch mechanism;

FIG. 8 is a front plan view of an anchor element of the present invention;

FIG. 9 is a partially cut-away orthogonal view of a preferred finger support type of modular package holder;

FIG. 10 is a partially cut-away side elevational view of a back surface protection type of modular package holder; and FIG. 11 is a partially cut-away top plan view of an oversized multi-nest type of modular package holder.

BEST MODE FOR CARRYING OUT INVENTION

The present invention is a non-dedicated fixture assembly particularly adapted for positioning and retaining integrated circuit packages for usage with conveyer-fed wave soldering machines. Expected uses of the present invention will lie in any field where package securing fixtures are utilized. The particularly expected utilizations of the inventive assembly are in wave soldering operations of integrated circuit chip packages in the semiconductor industry.

The preferred embodiment of the present invention is a support fixture assembly, known as a "pallet", shown in FIG. 1 in an exploded perspective view, and referred to herein by general reference character 10. In the perspective view of FIG. 1 it may be seen that the pallet assembly 10 is generally rectangular in shape. The pallet assembly 10 is adapted to support a plurality of individual chip packages 12. The preferred pallet assembly 10 includes an external carrier frame subassembly 14, an internal frame subassembly 16, a plurality of modular package holders 18, and a plurality of hinged securing gate subassemblies 20.

The exterior frame 14 includes a front wall 22, a left side wall 24, a back wall 26 and a right side wall 28. The various walls of the exterior frame 14 are arranged in a rectangular fashion with the side walls 24 and 28, in the preferred embodiment, being longer than the front wall 22 and the back wall 26. The various walls are constructed of titanium for strength and resistance to heat deformation, as well as light weight, and are held in an orthogonal relationship by a set of four interior corner blocks 30. The interior corner blocks 30 are situated inside of the intersections between adjacent walls and each of the walls is held to the interior corner block 30 by one or more fasteners 32, usually in the form of rivets, which maintain the adjacent walls in a strictly right angle relationship.

The left side wall 24 and the right side wall 28 are provided with longitudinally extending riding flanges 34 which are mounted approximately mid-height on the sidewalls 24 and 28. The riding flanges 34 are held in position by a pair of end support blocks 36 and a midspan support block 38 mounted on each side wall. The support blocks 36 and 38 are held by rivets 32 to both the side walls 24 and 28, respectively, and the associated riding flange 34. The riding flange 34 serves the purpose of allowing the pallet assembly 10 to mate with the object transport apparatus which carries the pallet assembly 10 through the wave soldering machine. The type of apparatus ordinarily used includes titanium "fingers" which support the pallet assembly 10 by the riding flange 34 and carry it through the wave solder operation. The vertical position of the riding flanges 34 is adapted to be modifiable such that the "parting line" of the assembly 10, with respect to the wave of solder, may be selected for optimal performance.

In actual usage, as will be discussed more thoroughly hereinafter, the portion of the pallet assembly 10 which is shown as the top in FIG. 1 is actually inverted such that it extends downward into the wave of solder.

The construction of the interior frame subassembly 16 is best understood by a simultaneous consideration of FIGS. 1, 2, 3 and 4. The primary components of the internal support frame subassembly 16 are a series of longitudinal plates 40 and a series of lateral plates 42. The longitudinal plates 40 are arrayed to extend between the front wall 22 and the back wall 26 while the lateral plates 42 are arrayed to extend between the left side wall 24 and the right side wall 28. As is shown in FIG. 2, each longitudinal plate 40 is provided with a series of first mating slots 44 extending upward (in the orientation selected for FIG. 1) while each lateral plate 42 is provided with a corresponding set of second mating slots 46 which extend downward. The interaction of the first mating slot 44 and the second mating slot 46 allows the longitudinal plates 40 and the lateral plates 42 to be arrayed such that they intersect at right angles while their upper surfaces may be co-planar.

As is particularly seen in FIGS. 1 and 3, the manner in which the longitudinal plates 40 and the lateral plates 42 are arrayed causes them to intersect at various positions to create receiving nests 48. Each receiving nest 48 represents the intersection of a pair of longitudinal plates 40 with a pair of lateral plates 42. As is seen in FIG. 1, the receiving nests 48 created by the preferred array of the longitudinal and lateral plates 40 and 42 creates a pattern in which the plates are arrayed in two rows of receiving nests 48 associated with each of the securing gate subassemblies 20 and a selectable number of columns of receiving nests 48 dependent upon the length of the gate subassemblies 20. As is illustrated in FIG. 3, each of the receiving nests 48 is square as to its interior such that the length of longitudinal plate 40 and the length of lateral plate 42 within the receiving nest 48 is equal.

As is clear from FIG. 1, the spacing of the plates 40 and 42 is not uniform throughout, although this is primarily a matter of choice of manufacture. The array shown in FIG. 1 shows uneven spaces between adjacent rows and adjacent columns for most efficient operation. However, it is extremely desirable that the receiving nests 48 themselves be precisely square cylindrical holes.

As is especially apparent from the bottom plan view of FIG. 4, the interior frame subassembly 16 further includes a set of longitudinal positioning rods 50 and a set of lateral positioning rods 52. The longitudinal positioning rods 50 are adapted to extend from the front wall 22 through to the back wall 26 passing through associated positioning rod apertures 54 in the lateral plates 42. In the preferred embodiment shown in FIG. 1, three longitudinal positioning rods 50 are provided. Similarly, the lateral positioning rods 52 extend between and are bonded to the left side wall 24 and the right side wall 28. The lateral positioning rods 52 pass through corresponding positioning rod apertures 54 in the longitudinal plates 40. In the preferred embodiment of FIG. 1, four of the lateral positioning rods 52 are provided. The longitudinal positioning rods 50 and the lateral positioning rods 52 provide structural integrity and support to the longitudinal plates 40 and the lateral plates 42 such that the relative positions of the plates is maintained in a constant manner. It is very important for precise soldering that the interior frame subassembly 16 and the associated receiving nests 48 have a constant orientation and position with respect to the remainder of the non-dedicated pallet assembly 10, particularly the riding flanges 34. The right angle interactions of the lateral and longitudinal plates 40 and 42 and positioning rods 50 and 52 provide this constant orientation.

Returning now to FIG. 2, it may be seen that the longitudinal plate 40 further includes a rectangular gate bar slot 54 in the upper surface thereof. A leaf spring slot aperture 58 is also provided directly beneath the gate bar slot 54. The gate bar slot 54 is provided to permit a portion of the securing gate subassembly 20 to extend downward into the longitudinal plate 40. The leaf spring aperture 58 is provided to permit mounting of a leaf spring 60, illustrated in FIG. 4. Each leaf spring 60 is adapted to be mounted on a pair of mounting flanges 62 which mate with the leaf spring apertures 58 on a pair of longitudinal plates 40. The leaf springs 60 include a pair of opposed stem portions 64 which terminate in spring pads 66 which are situated at the bottom end of the receiving nests 48. The spring pads 66 are situated such that they engage the bottom portions of the modular package holders 18 when they are inserted into the nest 48, as illustrated in FIG. 3. In this manner, the leaf springs 60 provide an elastic force against the modular package holders 18 which holds them against the portions of the securing gate subassembly 20. This helps to prevent slippage of the chip carriers 12 during handling and wave soldering operations.

The gate mechanism subassembly 20 is best understood by simultaneous consideration of FIGS. 1, and 3 through 8. As is seen in FIG. 1, the gate subassembly 20 is adapted to be attached to the right wall 28 of the external frame 14 and to extend across the internal frame 16 to hold the individual chip packages 12 in the package holders 18 which are supported within the receiving nests 48. In the preferred embodiment illustrated in FIG. 1, each gate subassembly 20 is adapted to secure twenty (20) chip carriers 12 when fully loaded, in two parallel rows of ten (10).

One of the primary elements of the securing gate subassembly 20 is a gate bar 68. The gate bar 68 is a substantially rectangular, solid device which extends laterally across the interior frame 16. The gate bar 68 terminates at the end adjacent to the right wall 28 in a hinge plate 70 which forms an integral portion of the gate subassembly 20. The hinge plate 70 as seen especially in FIG. 5, includes a pivot pin aperture 72 extending therethrough in a direction perpendicular to the axis of the gate bar 68. The pivot pin aperture 72 is adapted to receive an elongated pivot pin 74 which extends through the associated hinge plate 70 of each of the gate subassemblies 20 of the pallet assembly 10.

In the preferred embodiment 10 the interior surface of the right wall 28 is provided with a pair of terminal pin support blocks 76 situated just beyond the positions of the outermost gate subassemblies 20, and four (4) intermediate pin support blocks 78 situated intermediate the positions of the gate subassemblies 20. The pin support blocks 76 and 78 serve dual purposes in that they are situated such that they longitudinally position the gate subassemblies 20 by fitting about the hinge plates 70 to prevent longitudinal sliding, while also supporting the pivot pin 74 to permit the gate subassemblies 20 to rotate about the pivot pin 74. In order to accomplish these purposes the terminal pin support blocks 76 and the intermediate pin support blocks 78 are secured to the right side wall 28 by rivets 32 or other fastening means. Each of the pin support blocks 76 and 78 further includes a co-linear pivot pin aperture 72 for receiving and supporting the pivot pin 74. It is desirable that the pivot pin 74 be mounted in the support blocks 76 and 78 and the various hinge plate 70 in such a manner that it is removable. The removability feature makes it possible to replace one of the gate subassemblies 20 in the event that an alternately arrayed subassembly is desired or in the event of damage, without requiring rebuilding the entire device 10. Since the gates 20 are the most likely components of the structural portions of the pallet assembly 10 to become damaged during usage, it is desirable to provide a mechanism for ready replacement on a modular basis.

The end of the gate bar 68 opposite the hinge plate 70 is formed into a latch post 80 which is adapted to fit within the gate slot 39 formed in the left sidewall 24. As is particularly shown in FIG. 7, when the gate 20 is in the closed position, the latch post 80 extends downward into the V-shaped gate slot 39 to rest substantially against the bottom thereof and is then held in position by a latch hook 82 mounted on a latch pivot 84 which is attached to the left side wall 24. The latch hook 82, also shown in FIGS. 2 and 5, but particularly in FIG. 7, is adapted to slide over the latch post 80 in such a manner that it prevents the gate subassembly 20 from accidentally opening. In order to provide a preloading force which helps to prevent the latch hook 82 from accidentally becoming disengaged during handling, a gate spring 86 is further provided. The gate spring 86, as illustrated in FIG. 4, is shown in the preferred embodiment 10 as being a leaf spring substantially similar to the leaf spring 60 utilized to provide preloading to the modular package holders 18. However, any other form of preloading mechanism will suffice.

The gate bar 68, as particularly illustrated in FIGS. 5 and 6, is in the form of a rectangular bar having a greater height than thickness. This shape has been found to be desirable in that it is particularly critical in the use of the present invention that the gate bar 68 be subject to minimal vertical deflection. Horizontal deflection is not as critical to operation, hence the thickness need not be as great in this dimension. A substantially solid titanium gate bar 68, of the shape illustrated, has been found to minimize vertical deflection under the high heat and moderate mechanical stress conditions which obtain during usage.

Intermediate its terminal ends at the hinge plate 70 and the latch post 80, the gate bar 68 is seen to include a hinge end portion 88, a first bend 90, a central span portion 92, a second bend 94, and a latch end portion 96. As a result of the first bend 90 and the second bend 94, the hinge end portion 88 and the latch end portion 96 are seen in FIG. 5 to be vertical displaced above the central span portion 92. This displacement is desirable in order to allow the gate bar 80 to clear the longitudinal positioning rods 50 extending from the front wall 22 to the rear wall 26. Similarly, a rod depression 98 is provided in approximately the center of the central span portion 92 to receive the remaining longitudinal positioning rod 50.

In order to compensate for mechanical deflective forces, especially during the high temperature conditions of the wave soldering operation, the central span portion 92 is formed to have a radial curvature such that it is slightly lower in the center than at the locations adjacent to the end portions 88 and 96. This is important in maintaining constant pressure on the chip packages 12 in the center of the rows as well as those at the ends. This ensures that each of the packages 12 in each row is maintained in the same vertical position with respect to the wave of solder and thus ensures consistent soldering of the leads. In the preferred embodiment 10, wherein the center span 92 has a length of 22.90 cm (9.125 in.), the radius of curvature is 0.025 cm (0.010 in).

The primary purpose of the gate subassemblies 20 is to hold the chip packages 12 in position on the modular package holders 18. The component which actually accomplishes this is an anchor element 100, illustrated particularly in FIG. 8, and also shown in FIGS. 3, 5 and 6. The anchor element 100 is adapted to be firmly mounted upon the gate bar 68 and includes a pair of opposingly extending prongs 102 extending perpendicularly to the gate bar 68. Each of the prongs 102 terminates in a prong tip 104 which extends downward to contact the upper surface of the chip package 12 when the chip package 12 is in position on a modular package holder 18 contained in one of the receiving nests 48, when the gate assembly 20 is in the closed position. Since the anchor elements 100 extend vertically beyond the chip packages 12 these components will actually encounter the wave of solder during the soldering operation. Therefore, it is desirable that the anchor elements 100 be relatively thin with respect to the direction of motion of the pallet assembly 10 through the solder. In the orientation of FIG. 1, the pallet assembly 10 passes through the solder wave with the front wall 22 being the leading element and the rear wall 26 being the trailing element. The direction of motion is thus longitudinal with respect to the pallet assembly 10 and the anchor elements 100 are arrayed such that the prongs 102 are edgewise to the wave of solder during the operation. This minimizes solder pickup by the components of the pallet assembly 10 and further minimizes the amount of heat transferred to the pallet assembly 10 during the wave soldering operation. For this reason also, the prongs 102 and prong tip portions 104 are mounted so as to extend vertically above the main body of the central span portion 92 such that the gate bar 68 itself does not encounter the solder.

The particular construction of anchor elements 100, and the manner in which they are attached to the gate bar 68, is particularly illustrated in FIGS. 8, 3, 5 and 6. The front plan view of an anchor element 100, shown in FIG. 8, illustrates that the two prongs 102 are attached to an anchor body 106. The anchor body 106 includes a bar receiving aperture 108 through which the gate bar 68 slides, such that the anchor element 106 may be mounted thereon. The dimensions of the bar receiving aperture 108 are slightly larger than the outside dimensions of the gate bar 68 in order to allow easy sliding of the anchors 100 on the gate bar 68.

The actual positioning of the anchors 100 on the gate bar 68, in order to prevent any slippage and to maintain constant positioning with respect to the wave of solder, is accomplished by a pair of positioning detents 110 at the sides of the bar receiving aperture 108. The positioning detents 110 are symmetrical and extend beyond the center portion of the sides of the bar receiving aperture 108 a distance of 0.025 cm (0.010 in), the preferred embodiment 10.

The shape and location of the positioning detents 110 is adapted to permit the locking into position and supporting of the anchor elements 100 by the interaction of a pair of opposing interlocking plates 112, particularly illustrated in FIG. 5. Each of the interlocking plates 112 is adapted to mate with an adjacent one of the interlocking plates 112 with each junction being capable of forming the positioning location for one of the anchor elements 100. The interlocking plates 112 are held in position on the gate bar 68 by a pair of securing pins 114 extending through pin apertures 116 formed in the central span portion 92 of the gate bar 68. Each pair of securing pins 114 secures an interlocking plate 112 on each side of the gate bar 68 (see FIG. 6).

Each of the interlocking plates 112 is identical in construction and they are adapted to interlock with others of the interlocking plates 112 by forming the ends of each plate to be mirror images. As shown in FIG. 5, each end of each interlocking plate 112 includes a first protrusion 118, a first depression 120, a second protrusion 122, and a second depression 124. The first protrusion 118 of one of the interlocking plates 112 is adapted to align with the first depression 120 on the opposing end of an adjacent interlocking plate 112. Similarly, the second protrusion 122 is adapted to mate with the second depression 124 of an adjacent interlocking plate 112. In this alignment the outside surfaces of the second protrusions 118 on each of the two interlocking plates 112 adjacent to a given anchor member 100 will abut tightly against the inside end surfaces of the positioning detents 110. The protrusions 118 and 122 and the depressions 120 and 124 are adapted to mate in a tight enough fashion that the interlocking plates 112, in interlocked mode, fit very tightly against the inside of the positioning detents 110 such that there is no vertical free play.

It is noted that the first protrusion 118 is shorter in length than the second protrusion 122 and that the first depression 120 is not as deep as the second depression 124. This is because the interaction of the first protrusion and the first depression on the opposed interlooking plates 112 occurs at positions vertically beyond the positioning detent 110 on the anchor element 100. Thus, as shown in FIG. 5, the anchor body 106 is horizontally held in position, both high and low on each side, by the force against it provided by the first protrusions 118 against the first depressions 120. Consequently, when the interlocking plates 112 appearing on both sides of an anchor element 100 on both sides of the gate bar 58 are in position and held by the securing pins 114, the anchor element 100 is prevented from any vertical, horizontal, or twisting motion such that its position is strictly constant with respect to the gate bar 68 during usage. This is of great value in maintaining accurate positioning during the soldering operation.

The elements which actually support the chip packages 12 during the wave soldering operation are the modular package holders 18. The modular package holders 18 are adapted to fit within the receiving nests 48 such that their bottoms rest upon the leaf spring pads 66 and such that the prong tips 104 of the anchor elements 100 push down upon the approximate center of a chip package 12 which is carried on the particular modular package holder 18. One of the substantial advantages of the present invention is that the modular package holders 18 utilized in different ones of the pallet assemblies 10, or even within the same assembly 10, need not be all alike. The modular package holders 18, which are expected to be primarily constructed of solid Teflon, may be cast, milled or otherwise formed to particular shapes to conform the particular chip package 12 desired.

Three examples of preferred modular package holders 18 are illustrated in FIG. 9, 10 and 11. FIG. 9 illustrates a finger support holder 126, FIG. 10 illustrates a surface protection holder 128 and FIG. 11 illustrates a multi-nest holder 130. These are but a few of the envisioned types of available modular package holders 18.

Referring now to FIG. 9, a finger support type of modular package holder 126 is illustrated in a partially cut away orthogonal view. This variety of package holder is considered the basic model which will be utilized with the majority of currently popular chip packages 12. It may be seen that the finger support holder 126 includes a platform portion 132 and a post portion 134. The platform portion 132, also seen on the analogous surface protection holder 128 of FIG. 10, comprises the upper portion of the presently preferred modular package holders 18. The platform portion 132 includes a platform base 136 which is generally rectangular in shape and is solid such that the bottom of the platform base 136 will contact the upper edges of the longitudinal plate 40 and the lateral plate 42 in the area of the receiving nest 48 when the holder 18 is forced downward. The thickness of the platform base 136 is selected so that the particular chip package 12 involved is supported at the appropriate height with respect to the wave of solder.

In the finger support holder 126 of FIG. 9, a series of finger posts 138 extend upward from portions of edges of the platform base 136. The finger posts 138 are flat on their interior side to provide side support to the chip package 12 and are provided with a protruding ledge 140 which supports the chip package 12 above the surface of the platform base 136, but below the top of the finger posts 138. The existence of the ledges 140 provides an air gap between the chip package 12 and the platform base 136. This can be desirable both for minimizing heat transfer to the holder element 126 and also for cleaning of the chip packages 12 without removing them from the pallet assembly 10.

The surface protection holder 128 illustrated in FIG. 10 is adapted particularly for use with chip packages 12 which have components on the reverse side from the leads which should not be contacted by the solder. For this purpose, the platform portion 132 is not provided with finger posts 38 but instead has an enclosing peripheral ridge 142 which extends slightly above the surface of the platform base 136. In the surface protection holder 128 the chip package 12 rests directly on the platform base 136 and is restrained from the sides by the peripheral ridge 142. The dimensions of the surface protection holder 128 are selected such that the peripheral ridge 142 abut closely against the side of the chip package 12 such that the solder is prevented from reaching the surface of the chip package 12 which lies on the platform base 136. This prevents any of the solder from reaching sensitive areas such as large gold contacts which occur on some chip packages 12.

Both the finger support holder 126 and the surface protection holder 128 utilize the same type of post portion 134. The preferred post portion 134 of these two embodiments is octagonal in cross section throughout most of its length and has a rounded bottom 144 for contacting the pad portion 66 of the leaf spring 60. The octagonal post portion 134 has eight identical side panels 146, arranged in a regular octagon with each side panel 146 being at a 135 degree angle to each adjacent side panel 146. This shape is selected such that the modular package holders 126 and 128 may be placed within the receiving nests 48 in any of eight orientations. In each permissible orientation four of the side panels 146 will nearly be flush against the interior sides of the receiving nests 48 while the remaining four intermediate side panels 146 will cut across the corners of the receiving nest 48. The octagonal shape of the post portion 134 insures that the package holders 18 are firmly supported in all horizontal directions. This further insures that the chip packages 12 are supported at or very near their centers by the prong tips 104.

In the third alternate modular package holder 18 which is presently envisioned, the multi-nest holder 130 illustrated in FIG. 11, the octagonal features of the post portion 134 are not required. The multi-nest holder 130 is provided with a pair of alternate post portions 148 situated near the corners thereof. The alternate post portions 148 are round rather than octagonal. The spacing between the alternate posts portions 148 is such that they are adapted to fit either in two adjacent nests in the same row or into adjacent nests 48 in the same column on the preferred pallet assembly 10. The two positions support provided by the pair of alternate post portions 148 serves the same purpose as the octagonal shape of the preferred post portions 134. The rounded shape for the alternate posts 148 is preferred for ease of manufacturing.

In other respects, the multi-nest holder 130 is essentially an oversized version of the finger support holder 126, particularly with respect to the platform portion 132. Since the multi-nest holder 130 is adapted to span two adjacent nests it is also adapted to hold chip packages 12 that are very, large in size. In the particular version of the multi-nest holder 130 illustrated in FIG. 11, the chip package 12 is supported by a series of finger posts 138 having ledges 140. The separation of the finger posts 138 is such that a very large size chip package is supported above the surface of the platform base 13s and will be held in position by the prong tips 104 of two different anchor elements 100. If the two nests 48 selected are in the same row then the anchor elements 100 holding the chip package 12 on the multi-nest holder 130 will be adjacent anchor elements 100 on the same gate subassembly 20. If the adjacent nests in which the multi-nest holder 130 is situated are in the same column then one anchor element 100 from each of two adjacent subassemblies 20 will provide the support for the chip package 12. If the preferred anchor elements 100 are utilized then this two point support will occur near the edges of the chip package 12. An alternate mechanism, when multi-nest holder 130 is utilized, is to utilize an alternate anchor element having elongated prongs 102 such that the associated prong tips 104 fall in the approximate center of the oversized chip package.

All of the elements of the preferred pallet subassembly 10, with the exception of the modular chip package holders 18, are preferably constructed of titanium. Titanium is the preferred material because it has excellent strength, is light in weight and has minimal heat deflection characteristics in the temperatures utilized in wave soldering operations. Titanium is also adaptable to being milled and formed into the appropriate components. The dimensions of the preferred pallet assembly 10 are primarily a matter of choice dependent on the type of wave solder machine with which the assembly 10 is to be utilized. However, in the preferred embodiment 10 of FIG. 1 the receiving nests 48 are squares having the dimension of 0.941 cm (0.375 in.), while the front wall 22 and the back wall 26 have a height of 1.631 cm (0.650 in) while the left and right walls 24 and 28 have a height of 2.96 cm (1.180 in). The riding flange 34 is selected to be displaced from the parting line (center line of packages 12) by a distance of 0.502 cm (0.020 in). The positioning rods 50 and 52 are selected to have a diameter of approximately 0.392 cm (0.156 in) to provide very firm support and orientation to the longitudinal and lateral plates 40 [1.255 cm (0.50 in) height] and 42 [1.569 cm (0.625 in) height].

A preferred modular package holders 18 are constructed of solid Teflon TM, either by molding or by milling from solid blocks. Teflon TM is the presently preferred material because of its excellent temperature deformation resistance, ease of cleaning, light weight, low heat transfer capability, and ease of formation. The dimensions of the package holders 18 are controlled by the particular type of pallet assembly 10 in which the modular package holders 18 are to be utilized; a typical finger support holder 126 will have a total height of 2.01 cm (0.800 in) with the platform portion 132 comprising approximately 0.50 cm (0.20 in) of this height. The finger posts 138 will extend approximately 0.25 cm (0.10 in) above the surface of the platform base 138 with the ledges 140 being situated 0.15 cm (0.06 in) above the surface of the platform base 136. The typical platform base 138 will have lateral dimensions of 0.753 cm (0.375 in) width and 1.318 cm (0.525 in) length. The post portion 134 (octagonal) has a thickness of 0.929 cm (0.370 in) to allow clearance for sliding within the nest 48. The radius of the post bottom is 0.753 cm (0.375 in).

Of course, many alternate dimensions and configurations of the above elements are possible and are envisioned for use with the pallet assembly 10 of the present invention. In particular, it is envisioned that alternate materials may be utilized for the modular package holders 18 and for the components of the frames 14 and 16 and the gate subassemblies 20. A model using nine (9) gate subassemblies 20 is already planned. Alternate configurations of the gate subassemblies 20 are also envisioned, including alternate methods of mounting the anchor portions on the gate bars 68. Furthermore, it is envisioned that an infinite variety of different modular support holders 18 may be constructed to accommodate different sizes and configurations of chip packages 12.

Those skilled in the art will readily observe that numerous other modifications and alterations of the assembly may be made while retaining the teachings of the invention. Accordingly, the above disclosure is not intended as limiting. The appended claims are therefor to be interpreted as encompassing the entire spirit and scope of the invention.

INDUSTRIAL APPLICABILITY

The non-dedicated pallet assembly 10 of the present invention is especially adapted for utilization in conjunction with wave solder apparatus designed for applying solder to chip packages 12. The particular embodiment 10 illustrated in the drawings herein includes a riding flange 34 which is particularly adapted to mate with the fingers of the conveyor portion of the wave solder apparatus. However, minor modifications will permit the pallet assembly to be utilized in other utilizations and apparati.

When a user determines to utilize the non-dedicated pallet assembly 10 of the present invention the user will have in mind a particular type of chip package 12 which requires an operation. In some cases the user will have various types of chip packages all requiring the same operation. In either of these cases the first step which the user will undertake in order to effectively use the non-dedicated pallet assembly 10 of the present invention is to select the appropriate form of modular package holder 18 for each of the chip packages 12 involved. The user will also determine the lateral orientation desired in order to obtain the best coverage of the solder on the leads of the chip packages 12. The octagonal post portions 134 permit the packages to encounter the solder with any of the edges or corners being the leading portion.

Once the particular modular package holders 18 have been selected for each of the chip packages 12 the gate subassemblies 20 are opened so that the modular package holders 18 may be placed within the appropriate receiving nests 48. The package holders 18 are placed within the receiving nests 48 in the orientation selected by the user and the packages 12 are placed on the package holders 18. In the case of a finger support holder 126 the chip package 18 will be supported above the surface of the post portion and will have an air gap between the chip package 12 and the platform portion 132. In the case of a surface protection holder 128 the reverse surface of the chip package 12 will rest directly against the surface of the platform base 138 and the peripheral ridge 142 will prevent any of the solder from accessing the reverse face of the chip package 12. The gate subassemblies 20 are then closed by rotation about the hinge pivot pin 74 such that the latch posts 80 are in position to be held closed by the latch hook 82. The action of the gate spring 84 maintains a back pressure against the latch post 80 and the latch hook 82 so that accidental disengagement cannot occur. When the gate subassembly 20 is closed the prong tips 104 of the anchor elements 100 will be situated directly above the center of the receiving nests 48 and consequently, in most cases, directly in the center of the chip package 12. The interaction of the anchor elements 100 and the leaf springs 60 causes a resilient but firm support of the chip package 12 within the modular package holder 18 with the chip package 12 being held in a constant orientation in all physical dimensions.

The non-dedicated pallet assembly 10 is then ready for utilization by placing it on a conveyer portion of the appropriate wave solder apparatus and activating the apparatus. Once the wave soldering operation has been completed the gate subassemblies 20 are opened and the chip packages 12 are removed. Both the modular package holders 18 and the remaining elements of the pallet assembly 10 are adapted for easy cleaning due to their selection of materials and the availability of all surfaces to cleaning solvents and agitation.

The ease of usage, adaptability of usage and ease of cleaning are all substantial advantages of the present invention. Those objects and advantages discussed above are also important in making this invention a substantial improvement over the existing art in the field of pallets. In light of all of the above, it is expected that the invention of the non-dedicated pallet assembly 10 of the present invention will enjoy widespread commercial utility and industrial applicability.

I claim:

1. A modular object support holder in combination with a fixture including one or more receiving positions in the nature of a square hole and including one or more gate subassemblies adapted to vertically secure said holder in one of said square holes, comprising:
   a platform portion conforming to the shape of the object to be supported thereon; and
   a post portion adapted to slidably engage the square hole so as to firmly laterally engage such hole, at least an axial hole-engaging portion of said post portion being formed to have a regular octagonal cross section.

2. The modular object support holder of claim 1 wherein
   the platform portion further includes a platform base and a plurality of peripheral finger posts, each finger post including an inwardly extending ledge formed thereon such that the object is vertically supported on the upper surface of said ledges and laterally supported by the interior, the portion of said finger posts extending above said ledges.

3. The modular object support holder of claim 1 wherein
   the platform portion further includes a planar platform base upon which the object directly rests and a peripheral ridge extending about said platform base so as to laterally restrain the object.

4. The modular object support holder of claim 1 wherein
   the post portion is provided with a rounded cap portion on the end thereof opposite the platform portion.

5. The modular object support holder of claim 2 wherein
   said ledges are disposed above said platform base such that a gap is formed intermediate said platform base and the object.

6. A modular support holder for use with a fixture including one or more receiving positions in the nature of a square hole, comprising:
   a platform portion conforming to the shape of the object to be supported thereon; and
   a post portion adapted to slidably engage the square hole so as to firmly laterally engage such hole, at least an axial hole-engaging position of said post portion being formed to have a regular octagonal cross section;

wherein the platform portion further includes a platform base and plurality of peripheral finger posts, each finger post including an inwardly extending ledge formed thereon such that the object is vertically supported on the upper surfaces of said ledge and laterally supported by the interior of the portion of said finger posts extending above said ledges.

7. The modular object support holder of claim 6 wherein
said ledges are disposed above said platform base such that a gap is formed intermediate said platform base and the object.

* * * * *